United States Patent
Miyao et al.

(10) Patent No.: US 10,800,659 B2
(45) Date of Patent: Oct. 13, 2020

(54) POLYCRYSTALLINE SILICON ROD, PROCESSING METHOD FOR POLYCRYSTALLINE SILICON ROD, METHOD FOR EVALUATING POLYCRYSTALLINE SILICON ROD, AND METHOD FOR PRODUCING FZ SINGLE CRYSTAL SILICON

(71) Applicant: Shin-Etsu Chemical Co., Ltd., Tokyo (JP)

(72) Inventors: Shuichi Miyao, Niigata (JP); Shigeyoshi Netsu, Niigata (JP); Junichi Okada, Niigata (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 15/537,968

(22) PCT Filed: Dec. 9, 2015

(86) PCT No.: PCT/JP2015/006142
§ 371 (c)(1),
(2) Date: Jun. 20, 2017

(87) PCT Pub. No.: WO2016/103608
PCT Pub. Date: Jun. 30, 2016

(65) Prior Publication Data
US 2017/0341943 A1   Nov. 30, 2017

(30) Foreign Application Priority Data
Dec. 25, 2014  (JP) .................. 2014-263296

(51) Int. Cl.
*C01B 33/02*   (2006.01)
*C01B 33/035*  (2006.01)
(Continued)

(52) U.S. Cl.
CPC ............ *C01B 33/02* (2013.01); *C01B 33/035* (2013.01); *C30B 13/30* (2013.01); *C30B 29/06* (2013.01);
(Continued)

(58) Field of Classification Search
CPC combination set(s) only.
See application file for complete search history.

(56) References Cited

U.S. PATENT DOCUMENTS 4,147,814 A   4/1979  Yatsurugi et al.
4,805,556 A * 2/1989  Hagan .................. C01B 33/035
                                                                118/715
(Continued)

FOREIGN PATENT DOCUMENTS

JP   37-18861 B    12/1962
JP   53-108029 A    9/1978
(Continued)

OTHER PUBLICATIONS

International Search Report dated Feb. 23, 2016, issued in counterpart International Application No. PCT/JP2015/006142 (5 pages).
(Continued)

*Primary Examiner* — Erin F Bergner
(74) *Attorney, Agent, or Firm* — Westerman, Hattori, Daniels & Adrian, LLP

(57) ABSTRACT

For evaluating a polycrystalline silicon rod to be used as a raw material for production of FZ Si single crystals, novel evaluation values (values of characteristics×amount of crystals) including the amount of crystals grown in the growth direction (radial direction) are defined and the homogeneity in crystal characteristics in the growth direction (radial direction) is evaluated. Specifically, the homogeneity of the polycrystalline rod is evaluated by sampling a plurality of specimen plates each having, as a principal plane thereof, a (Continued)

150mm cross-section perpendicular to a radial direction of the polycrystalline rod grown by a Siemens method at equal intervals in the radial direction, determining values of characteristics of the crystals of the specimen plates by measurements, and by using evaluation values obtained by multiplying amounts of the crystals (relative amounts of the crystals) at sites where the specimen plates have been sampled by the values of the crystal characteristics.

6 Claims, 2 Drawing Sheets

(51) Int. Cl.
    *C30B 29/06* (2006.01)
    *C30B 35/00* (2006.01)
    *C30B 13/30* (2006.01)
    *G01N 23/20* (2018.01)
    *G01N 23/207* (2018.01)
    *C30B 13/00* (2006.01)

(52) U.S. Cl.
    CPC ............ *C30B 35/007* (2013.01); *G01N 23/20* (2013.01); *G01N 23/207* (2013.01); *C30B 13/00* (2013.01)

(56) References Cited

U.S. PATENT DOCUMENTS

| | | | |
|---|---|---|---|
| 2002/0014197 A1* | 2/2002 | Keck | C23C 16/24 117/87 |
| 2008/0286550 A1 | 11/2008 | Sofin et al. | |
| 2010/0272922 A1* | 10/2010 | Revankar | C01B 33/035 427/588 |
| 2011/0229717 A1 | 9/2011 | Kraus | |
| 2011/0274926 A1 | 11/2011 | Oda et al. | |
| 2014/0033966 A1 | 2/2014 | Miyao et al. | |
| 2014/0302239 A1 | 10/2014 | Kurosawa et al. | |
| 2015/0047554 A1 | 2/2015 | Miyao et al. | |
| 2015/0107508 A1 | 4/2015 | Ishida et al. | |
| 2015/0185167 A1 | 7/2015 | Miyao et al. | |

FOREIGN PATENT DOCUMENTS

| | | |
|---|---|---|
| JP | 4-219398 A | 8/1992 |
| JP | 9-165296 A | 6/1997 |
| JP | 11-180798 A | 7/1999 |
| JP | 2008-285403 A | 11/2008 |
| JP | 2011-5604 A | 1/2011 |
| JP | 2011-195441 A | 10/2011 |
| JP | 2013-112566 A | 6/2013 |
| JP | 2013-193902 A | 9/2013 |
| JP | 2013-217653 A | 10/2013 |
| JP | 2014-1096 A | 1/2014 |
| JP | 2014-31297 A | 2/2014 |
| JP | 2014-34506 A | 2/2014 |
| WO | 2010/098319 A1 | 9/2010 |
| WO | 2012/004969 A1 | 1/2012 |
| WO | 2012/164803 A1 | 12/2012 |
| WO | 2013/150758 A1 | 10/2013 |
| WO | 2014/103939 A1 | 7/2014 |

OTHER PUBLICATIONS

Office Action dated Nov. 28, 2017, issued in counterpart Japanese Application No. 2014-263296, with English translation (13 pages).

* cited by examiner

POLYCRYSTALLINE SILICON ROD, PROCESSING METHOD FOR POLYCRYSTALLINE SILICON ROD, METHOD FOR EVALUATING POLYCRYSTALLINE SILICON ROD, AND METHOD FOR PRODUCING FZ SINGLE CRYSTAL SILICON

TECHNICAL FIELD

The present invention relates to a technology for producing a polycrystalline silicon rod, more particularly to a technology for producing a polycrystalline silicon rod suitable as a raw material for production of single crystal silicon by an FZ method.

BACKGROUND ART

Crystals of single crystal silicon essential for production of semiconductor devices and the like are grown by a CZ method or an FZ method, and polycrystalline silicon ingots and polycrystalline silicon rods are used as raw materials at this time. Such polycrystalline silicon materials are produced by a Siemens method in many cases (see Patent Literature 1 (Japanese Patent Publication No. 37-18861) and the like). The Siemens method refers to a method in which a silane raw material gas such as trichlorosilane or monosilane is brought into contact with a heated silicon core wire to thereby vapor-phase grow (deposit) polycrystalline silicon on the surface of the silicon core wire by a CVD (Chemical Vapor Deposition) method.

For example, when a crystal of single crystal silicon is grown by the CZ method, a polycrystalline silicon ingot is charged in a quartz crucible; a seed crystal is dipped in a silicon melt made by heating and melting the ingot and dissipating dislocation lines; while the seed crystal is, after being non-dislocated, gradually enlarged in diameter until a predetermined diameter is attained, the crystal is pulled upwards at a constant rate. At this time, if unmelted polycrystalline silicon remains in the silicon melt, the unmelted polycrystalline pieces drift in the vicinity of the solid-liquid interface by convection, causing inducing generation of dislocations and losing crystal lines.

Patent Literature 2 (Japanese Patent Laid-Open No. 2014-001096) discloses a method for evaluating the degree of crystalline orientation of polycrystalline silicon by an X-ray diffractometry, with the purpose of providing a technology of selecting in high quantitativity and repeatability the polycrystalline silicon suitable as a raw material for production of single crystal silicon, and contributing to the stable production of the single crystal silicon.

Patent Literature 2 proposes, in consideration of the problem that even if the polycrystalline silicon is one whose crystal grains cannot be recognized by the conventional visual observation, when single crystal silicon is produced by using the polycrystalline silicon as a raw material, loss of crystal lines is caused by being induced by generation of dislocations in some cases, as novel means, a method for evaluating the degree of crystalline orientation of polycrystalline silicon by an X-ray diffractometry, in which method a sampled specimen disc is arranged on a position where the Bragg reflection from a Miller index plane <hkl> is detected; the specimen disc is rotated in-plane in a rotational angle of φ with the center of the specimen disc as the rotational center so that an X-ray radiation region established by a slit φ-scans the principal plane of the specimen disc; a chart is acquired, which indicates the dependency of the Bragg reflection intensity from the Miller index plane <hkl> on the rotational angle (φ) of the specimen disc; a baseline is determined from the chart; and the values of the diffraction intensity of the baseline is used as an evaluation index of the degree of crystalline orientation.

The Patent Literature then construes that when single crystal silicon is grown by using a polycrystalline silicon rod or a polycrystalline silicon ingot selected based on the evaluation result of the above means, the generation of loss of crystal lines can be prevented in a high probability.

It is also reported that a polycrystalline silicon rod, in which, particularly as seen in the above-mentioned silicon rods A and B, a value obtained by dividing a maximum value of a plurality of values of baseline diffraction intensity for the Miller index plane <111> by a minimum value thereof is 1.5 or lower; also a value obtained by dividing a maximum value of a plurality of values of baseline diffraction intensity for the Miller index plane <220> by a minimum value thereof is 1.9 or lower; and the division value (I<111>/I<220>) is lower than 2.5 for either specimen plate, is suitable as a raw material for growth of single crystal silicon.

Patent Literature 3 (Japanese Patent Laid-Open No. 2013-217653) also discloses a method for evaluating the degree of crystalline orientation of polycrystalline silicon by an X-ray diffractometry, with the purpose of providing a technology of selecting in high quantitativity and repeatability the polycrystalline silicon suitable as a raw material for production of single crystal silicon, and contributing to the stable production of the single crystal silicon.

Specifically, it is disclosed that when a specimen disc sampled from a polycrystalline silicon rod is evaluated, peaks may emerge on a φ-scan chart in some cases and the smaller the number of the peaks and the narrower the half-value widths of the peaks, the more suitable the polycrystalline silicon rod as a raw material for production of single crystal silicon, and it is reported that the number of the peaks emerging on the φ-scan chart is preferably 24 peaks/$cm^2$ or less per unit area of the specimen disc for either of the Miller index planes <111> and <220>; and that it is preferable to select a polycrystalline silicon rod having an inhomogeneous crystal grain diameter of smaller than 0.5 mm for either thereof as a raw material for production of the single crystal silicon, where the inhomogeneous crystal grain diameter is defined as a value obtained by multiplying a half-value width of a peak by $\delta L = 2^{1/2} \pi R_0 / 360$ obtained, wherein $R_0$ is the radius of the specimen disc.

Patent Literature 4 (Japanese Patent Laid-Open No. 2014-031297) also discloses a method for selecting a polycrystalline silicon rod to be used as a raw material for production of single crystal silicon, with the purpose of providing a technology of selecting in high quantitativity and repeatability the polycrystalline silicon suitable as a raw material for production of the single crystal silicon, and contributing to the stable production of the single crystal silicon.

Specifically, an electron backscatter diffraction image acquired by irradiating the principal plane of a specimen plate sampled from a polycrystalline silicon rod with electron beams is analyzed; and, as a raw material for production of single crystal silicon, selected is a polycrystalline silicon rod simultaneously satisfying (condition 1) that the sum total area of regions where no crystal grains of 0.5 μm or larger in grain diameter are detected is 10% or smaller of the whole area irradiated with the electron beams, and (condition 2) that the number of crystal grains in the range of 0.5 μm or larger and smaller than 3 μm in grain diameter is 45% or more of the total number of crystal grains detected. The Patent Literature reports that when single crystal silicon is grown by using such a polycrystalline silicon rod, since no loss of crystal lines is caused, the stable production of the single crystal silicon becomes possible.

Patent Literature 5 (Japanese Patent Laid-Open No. 2014-034506) also discloses a method for selecting a polycrystalline silicon rod to be used as a raw material for production of single crystal silicon, with the purpose of providing a technology of selecting in high quantitativity and repeatability the polycrystalline silicon suitable as a raw material for production of the single crystal silicon, and contributing to the stable production of the single crystal silicon.

Specifically, the method is a method in which a specimen plate with a cross-section as the principal surface perpendicular to the radial direction of a polycrystalline silicon rod grown by deposition by a chemical deposition method is sampled; the thermal diffusivity $\alpha(T)$ of the specimen plate is measured; and a polycrystalline silicon rod suitable as a raw material for production of single crystal silicon is selected based on a ratio $(\alpha(T)/\alpha_R(T))$ of thermal diffusivities in comparison with the thermal diffusivity, $\alpha_R(T)$, of a standard specimen. The Patent Literature reports that when single crystal silicon is grown by using a polycrystalline silicon rod thus selected, no loss of crystal lines occurs and thus stable production of the single crystal silicon becomes possible.

Any of the methods disclosed in these Patent Literatures evaluates values of characteristics and distributions thereof in the growth direction (diameter direction) of polycrystalline silicon rods, but any thereof does not put, as evaluation subjects, the rotational symmetry in the growth direction (radial direction) in the polycrystalline silicon rods, the homogeneity of crystals in the extension direction (axial direction) thereof, and the like.

In polycrystalline silicon rods to be used as a raw material for production of single crystal silicon by an FZ method, similarly to the distribution states of various characteristics in the growth direction (radial direction), the distribution states of various characteristics in the extension direction (axial direction) are important factors. Here, characteristics of crystals refer to, for example, the crystal formation amount, the crystal orientation, the crystal grain diameter, the thermal diffusivity and the thermal conductivity.

This is because when single crystal silicon is produced by an FZ method (floating zone melting method), a polycrystalline silicon rod is zone-melted while being rotated, but the homogeneity and the like of crystal characteristics in the extension direction (axial direction) have not been put so far as evaluation subjects.

CITATION LIST

Patent Literature

Patent Literature 1: Japanese Patent Publication No. 37-18861
Patent Literature 2: Japanese Patent Laid-Open No. 2014-001096
Patent Literature 3: Japanese Patent Laid-Open No. 2013-217653
Patent Literature 4: Japanese Patent Laid-Open No. 2014-031297
Patent Literature 5: Japanese Patent Laid-Open No. 2014-034506

SUMMARY OF INVENTION

Problem to be Solved

In order to obtain a polycrystalline silicon rod suitable as a raw material for production of single crystal silicon by an FZ method, however, it is needed to enhance "homogeneity in crystal characteristics" of the polycrystalline silicon rod as a whole, that is, not only the homogeneity in the growth direction (radial direction) in the polycrystalline silicon rod, but also the homogeneity in the extension direction (axial direction).

Additionally, not only the "homogeneity in crystal characteristics" but also the "homogeneity in shape" of the polycrystalline silicon rod is important. This is because when the "homogeneity in shape" in the extension direction (axial direction) of the polycrystalline silicon rod is low, since heat does not transfer uniformly, crystal habit lines indicating being in the non-dislocation state are lost (dislocated) in some cases.

The present invention has been achieved in consideration of such situations, and has an object to provide a technology for providing a polycrystalline silicon rod, excellent in the homogeneity in shape and the homogeneity in crystal characteristics, suitable as a raw material for production of single crystal silicon by an FZ method.

Solution to Problem

In order to solve the above problem, a polycrystalline silicon rod of a first aspect according to the present invention is a polycrystalline silicon rod to be used as a raw material for production of single crystal silicon by an FZ method, wherein the polycrystalline silicon rod has an entire length of 500 mm or larger and a difference $\Delta D_1$ between a maximum value $D_{max}$ and a minimum value $D_{min}$ of diameters over the entire length is 3 mm or smaller.

For example, the average diameter of the polycrystalline silicon rod is 300 mm or smaller.

A polycrystalline silicon rod of a second aspect according to the present invention is a polycrystalline silicon rod to be used as a raw material for production of single crystal silicon by an FZ method, wherein the polycrystalline silicon rod has an entire length of 500 mm or larger, and a difference $\Delta D_2$ of 6 mm or smaller between a maximum value $D_{max}$ and a minimum value $D_{min}$ of diameters of a nearly cylindrical virtual rotating body formed at a time when the polycrystalline silicon rod is rotated about the center axis in the extension direction thereof.

For example, the average diameter of the polycrystalline silicon rod is 300 mm or smaller.

A method for processing a polycrystalline silicon rod of the first aspect according to the present invention is a method for processing a polycrystalline silicon rod to be used as a raw material for production of single crystal silicon by an FZ method, wherein the polycrystalline silicon rod is a polycrystalline silicon rod having an entire length grown by a Siemens method of 500 mm or larger; and a side surface of the polycrystalline silicon rod is cylindrically ground so that the difference $\Delta D_1$ between a maximum value $D_{max}$ and a minimum value $D_{min}$ of diameters over the entire length becomes 3 mm or smaller.

A method for processing a polycrystalline silicon rod of the second aspect according to the present invention is a method for processing a polycrystalline silicon rod to be used as a raw material for production of single crystal silicon by an FZ method, wherein the polycrystalline silicon rod is a polycrystalline silicon rod by a Siemens method having an entire length grown of 500 mm or larger; and a side surface of the polycrystalline silicon rod is cylindrically ground so that a difference $\Delta D_2$ between a maximum value $D_{max}$ and a minimum value $D_{min}$ of diameters of a nearly cylindrical virtual rotating body formed when the polycrystalline silicon rod is rotated about the center axis in the extension direction thereof becomes 6 mm or smaller.

A method for evaluating crystals of a polycrystalline silicon rod according to the present invention is a method for evaluating crystals of a polycrystalline silicon rod to be used as a raw material for production of single crystal silicon by an FZ method, wherein a plurality of specimen plates each having, as the principal plane thereof, a cross-section perpendicular to a radial direction of the polycrystalline silicon rod grown by a Siemens method are sampled at equal intervals in the radial direction; values of a crystal characteristic of the specimen plates are determined by measurements; and the homogeneity of the polycrystalline silicon rod is evaluated by using evaluation values obtained by multiplying relative amounts of the crystals at sites where the specimen plates have been sampled by the values of the crystal characteristics.

In an aspect, the method comprises a step of determining the above evaluation values of two specimens sampled from sites at symmetrical positions about the center axis of the polycrystalline silicon rod, calculating a rotational symmetry from the obtained two evaluation values A and B by the following expression:

$$100-(|A-B|/(A+B)/2)\times 100,$$

and evaluating whether or not the average value in the axial direction of the rotational symmetries is 40% or higher.

Further, in an aspect, the method comprises a step of determining the above evaluation values of two specimens sampled from sites positioned at equal distances in the radial direction from the center axis of the polycrystalline silicon rod and on the same generating line in the case where the polycrystalline silicon rod is approximated to a cylinder, calculating a difference in rotational symmetry from the obtained two evaluation values C and D by the following expression:

$$(|C-D|/(C+D)/2)\times 100,$$

and evaluating whether or not the average value in the axial direction of the differences in rotational symmetry is 40% or lower.

In the above-mentioned method for evaluating crystals of a polycrystalline silicon rod, the crystal characteristic is, for example, any of an amount of crystals famed, a crystal orientation, a crystal grain diameter, a thermal diffusivity and a thermal conductivity.

The method for producing FZ single crystal silicon according to the present invention is a method for producing FZ single crystal silicon by using a polycrystalline silicon rod as a raw material, wherein the polycrystalline silicon rod is a polycrystalline silicon rod collected from a leg section of a reverse U-shape polycrystalline silicon section obtained by assembling one pair (two wires) of silicon core wires through a bridge in a reverse U-shape and depositing polycrystalline silicon; and when one end side of the polycrystalline silicon rod is a portion thereof in the vicinity of the bridge in a deposition furnace, and the other end side thereof is a portion thereof in the vicinity of an electrode in the deposition furnace, a floating zone melting step is initiated from the portion in the vicinity of the bridge of the polycrystalline silicon rod.

Advantageous Effects of Invention

In the present invention, novel evaluation values are introduced, which are "values of characteristics×relative amount of crystals", and a polycrystalline silicon rod having a "rotational symmetry" of 40% or higher based on the evaluation values is used as a polycrystalline silicon rod suitable as a raw material for production of single crystal silicon by an FZ method. Further, a polycrystalline silicon rod having a "difference in rotational symmetry" of 40% or lower is used as a polycrystalline silicon rod suitable as a raw material for production of single crystal silicon by an FZ method.

According to the present invention, there is provided a technology for providing a polycrystalline silicon rod, excellent in the homogeneity in shape and the homogeneity in crystal characteristics, suitable as a raw material for production of single crystal silicon by an FZ method.

DESCRIPTION OF EMBODIMENTS

Figure 1:
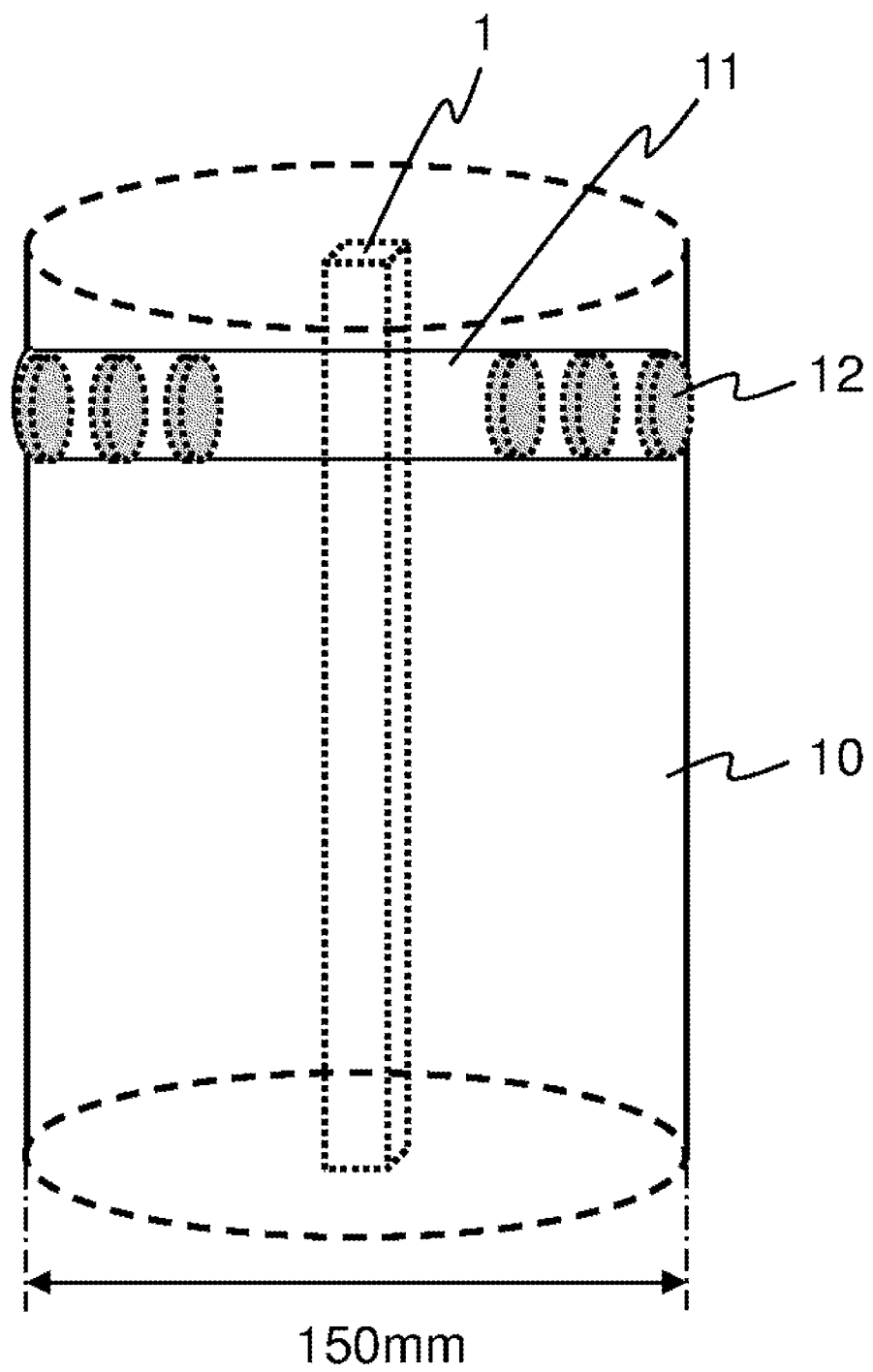
FIG. 1 is a view for interpreting one example of a method of sampling specimens used for evaluation of values of characteristics.

As a result of exhaustive studies in consideration that it is needed that a polycrystalline silicon rod suitable as a raw material for production of single crystal silicon by an FZ method be high in the "homogeneity in shape" in the extension direction (axial direction) of the polycrystalline silicon rod, and further, be high not only in the homogeneity in crystal characteristics in the growth direction (radial direction) of the polycrystalline silicon rod but also in the homogeneity in crystal characteristics in the extension direction (axial direction) thereof, the present inventors have achieved the present invention. Hereinafter, embodiments to carry out the present invention will be described by reference to the drawings.

[Homogeneity in Shape]

The cross-section of a polycrystalline silicon rod right after being obtained by a Siemens method is not a complete true circle but a slight ellipse in many cases. Additionally, the cross-sectional shape across the extension direction (axial direction) depends on sites. That is, a polycrystalline silicon rod as it is grown by a Siemens method is not "homogeneous in shape" in the extension direction (axial direction).

According to studies by the present inventors, when the "homogeneity in shape" in the extension direction (axial direction) of a polycrystalline silicon rod is low, in the case where the polycrystalline silicon rod is used as a raw material for production of single crystal silicon by an FZ method, crystal habit lines indicating being in the non-dislocation state are lost (dislocated) in some cases. This is because the constant heat conduction is not carried out in the successive state change of melting, convection and solidification by high-frequency heating.

Then, studies have been made on what degree of "circularity" of the cross-section of a polycrystalline silicon rod is suitable for a raw material for production of single crystal silicon by an FZ method, and further on what degree of the difference between a maximum value and a minimum value of diameters of a nearly cylindrical virtual rotating body formed when the polycrystalline silicon rod is rotated about the center axis in the extension direction is suitable for a raw material for production of single crystal silicon by an FZ method. Here, the evaluation was carried out using a polycrystalline silicon rod having an entire length of 500 mm or larger in entire length and an average diameter of 300 mm or smaller (5 to 12 inches in diameter), and the judgment of "being suitable" was made by the presence/absence of loss of crystal habit lines.

As a result, the finding has been acquired that when single crystal silicon is produced by using a polycrystalline silicon rod satisfying the following conditions by an FZ method, no loss of crystal habit lines is recognized.

That is, with respect to the "circularity" of cross-sections of the polycrystalline silicon rod, the condition is such that the difference $\Delta D_1$, between a maximum value $D_{max}$ and a minimum value $D_{min}$ of diameters over the entire length, is 3 mm or smaller.

Further with respect to the difference between a maximum value and a minimum value of diameters of a nearly cylindrical virtual rotating body formed when a polycrystalline silicon rod is rotated about the center axis in the extension direction, the condition is such that the difference $\Delta D_2$ between the maximum value $D_{max}$ and the minimum value $D_{min}$ is 6 mm or smaller. Here, the difference $\Delta D_2$ between the maximum value $D_{max}$ and the minimum value $D_{min}$ corresponds to a variation width in the radial direction when a polycrystalline silicon rod is clasped and rotated in an actual FZ process.

That is, the polycrystalline silicon rod according to the present invention is a polycrystalline silicon rod to be used as a raw material for production of single crystal silicon by an FZ method, wherein the polycrystalline silicon rod has an entire length of 500 mm or larger, and a difference $\Delta D_1$ between a maximum value $D_{max}$ and a minimum value $D_{min}$ of diameters over the entire length is 3 mm or smaller.

In the case where the shape of a polycrystalline silicon rod right after being obtained by a Siemens method does not satisfy the above conditions, the polycrystalline silicon rod comes to be formed by cylindrically grinding the side surface of the polycrystalline silicon rod.

That is, the method for processing a polycrystalline silicon rod according to the present invention is a method for processing a polycrystalline silicon rod to be used for a raw material for production of single crystal silicon by an FZ method, wherein the polycrystalline silicon rod is a polycrystalline silicon rod having an entire length grown by a Siemens method of 500 mm or larger; and a side surface of the polycrystalline silicon rod is cylindrically ground so that a difference $\Delta D_1$ between a maximum value $D_{max}$ and a minimum value $D_{min}$ of diameters over the entire length becomes 3 mm or smaller.

Further the polycrystalline silicon rod according to the present invention is a polycrystalline silicon rod to be used as a raw material for production of single crystal silicon by an FZ method, wherein the polycrystalline silicon rod has an entire length of 500 mm or larger; and the difference $\Delta D_2$ between a maximum value $D_{max}$ and a minimum value $D_{min}$ of diameters of a nearly cylindrical virtual rotating body formed when the polycrystalline silicon rod is rotated about the center axis in the extension direction thereof is 6 mm or smaller.

In the case where the shape of a polycrystalline silicon rod right after being obtained by a Siemens method does not satisfy the above conditions, as described above, the polycrystalline silicon rod comes to be formed by cylindrically grinding the side surface of the polycrystalline silicon rod.

That is, the method for processing a polycrystalline silicon rod according to the present invention is a method for processing a polycrystalline silicon rod to be used for a raw material for production of single crystal silicon by an FZ method, wherein the polycrystalline silicon rod is a polycrystalline silicon rod having an entire length grown by a Siemens method of 500 mm or larger; and a side surface of the polycrystalline silicon rod is cylindrically ground so that the difference $\Delta D_2$ between a maximum value $D_{max}$ and a minimum value $D_{min}$ of diameters of a nearly cylindrical virtual rotating body formed when the polycrystalline silicon rod is rotated about the center axis in the extension direction thereof becomes 6 mm or smaller.

[Homogeneity in Crystal Characteristics]

As described above, any of the evaluation methods disclosed in Patent Literatures 2 to 5 is a method using values of a crystal characteristic (or its distributions) in the growth direction (radial direction) of a polycrystalline silicon rod. However, the polycrystalline silicon rod is cylindrical; so no consideration of values of a crystal characteristic (or its distributions) in the extension direction (axial direction) is not suitable for suppressing the loss of crystal habit lines in an FZ operation.

Further when single crystal silicon is produced by an FZ method, since the single crystal is grown by melting, zone melting and solidification of a polycrystalline silicon rod while the polycrystalline silicon rod is clasped and rotated, also in the evaluation of values of a crystal characteristic (or its distributions) in the growth direction (radial direction) of the polycrystalline silicon rod, their rotational symmetry is needed to be evaluated.

Here, since the polycrystalline silicon rod is cylindrical, the amount of polycrystals present at a growth distance d from its center comes to be proportional to the square of d; and the amount of polycrystals becomes smaller on the nearer-center side, and that becomes larger on the more outer side. The present inventors have had an idea that factors affecting the thermal stability, the thermal load, and the convection of a melt in a melting interior, in an FZ process, are not simply values of a crystal characteristic but evaluation values (values of characteristic×amount of crystals) obtained by multiplying them by the amount of polycrystals contributing to the values of a crystal characteristic, and the idea has led to the present invention. That is, the present inventors have decided that novel evaluation values (values of a characteristic×amount of crystals) including the amount of crystals grown in the growth direction (radial direction) are to be defined and the homogeneity in crystal characteristics in the growth direction (radial direction) is to be evaluated. Here, the important point in the present invention is such that since the amount of crystals is a relative amount of polycrystals at a specimen sampling position, the above "amount of crystals" need not be an "absolute amount of crystals", instead, may be a "relative amount of crystals". In that sense, the above "evaluation values" may be values of characteristics×"relative amount of crystals".

The evaluation of the homogeneity in crystal characteristics in the extension direction (axial direction) is similar, and comes to be carried out by using the above evaluation values (values of a characteristic×relative amount of crystals).

The above-mentioned evaluation values (values of a characteristic×relative amount of crystals) are, for example, the following.

FIG. 1 is a view for interpreting one example of a sampling method of specimens provided for evaluation of values of a characteristic; and in the example illustrated in the figure, a rod 11 of about 20 mm in diameter and about 750 mm in length is scooped out perpendicularly to the axial direction of a polycrystalline silicon rod from a portion in the vicinity of a bridge of the polycrystalline silicon rod 10 of about 150 mm in diameter grown by deposition on a silicon core wire 1 by a Siemens method, that is, from a side-surface side of a site on a highest position of the polycrystalline silicon rod 10 in a furnace, and 16 sheets in total of specimen plates 12 of about 2 mm in thickness are sampled at 10-mm intervals from the rod 11. Then, for each of these specimen plates 12, Bragg reflection intensities from Miller index planes <111> and <220> are determined.

Similarly, a rod 11 of about 20 mm in diameter and about 750 mm in length is scooped out perpendicularly to the axial direction of the polycrystalline silicon rod from a portion in the vicinity of an electrode of the polycrystalline silicon rod 10, that is, from a side-surface side of a site on a lowest position of the polycrystalline silicon rod 10 in the furnace, and 16 sheets in total of specimen plates 12 of about 2 mm in thickness are sampled at 10-mm intervals from the rod 11. Then, for each of these specimen plates 12, Bragg reflection intensities from Miller index planes <111> and <220> are determined.

In the present invention, the symmetry in the growth direction (radial direction) of each site of the polycrystalline silicon rod is evaluated by the product of a diffraction intensity value as a value of a crystal characteristic and a relative amount of crystals. Here, the determination of the "relative amount of crystals" to calculate the evaluation value involves first determining $d^2$ by squaring a distance d, from the center, of a site from which each specimen plate has been sampled, and determining $\Delta d^2$, which is a difference in the $d^2$ value between specimen plates sampled adjacently.

Table 1 collectively shows sampling positions (distances from the center: d) of 16 sheets in total of specimen plates (SPL) sampled from a portion in the vicinity of the bridge (site positioned at the highest position in the furnace), values $d^2$ obtained by squaring the d, differences $\Delta d^2$ in the $d^2$ value between adjacent specimen plates, Bragg reflection intensities ($I^{<111>}$ and $I^{<220>}$) from Miller index planes <111> and <220> being measurement values, and evaluation values ($I^{<111>} \times \Delta d^2$ and $I^{<220>} \times \Delta d^2$) obtained by respectively multiplying the $I^{<111>}$ and $I^{<220>}$ by the differences $\Delta d^2$. Here, the average value of the "rotational symmetries" is 88% for <111>, and 89% for <220>.

TABLE 1

| SPL. No. | Distance from Center | | | Measurement Value | | Evaluation Value | | Rotational Symmetry | |
|---|---|---|---|---|---|---|---|---|---|
| | d (cm) | $d^2$ | $\Delta d^2$ | $I^{<111>}$ (cps) | $I^{<220>}$ (cps) | $I^{<111>} \times \Delta d^2$ | $I^{<220>} \times \Delta d^2$ | <111> (%) | <220> (%) |
| 1 | 7 | 49 | 13 | 9,161 | 9,337 | 119,095 | 121,375 | 88.4 | 91.7 |
| 2 | 6 | 36 | 11 | 9,545 | 9,922 | 104,992 | 109,139 | 81.6 | 94.6 |
| 3 | 5 | 25 | 9 | 9,110 | 9,149 | 81,991 | 82,340 | 80.6 | 77.8 |
| 4 | 4 | 16 | 7 | 9,354 | 10,909 | 65,481 | 76,362 | 99.5 | 99.2 |
| 5 | 3 | 9 | 5 | 8,097 | 10,919 | 40,484 | 54,595 | 90.5 | 97.8 |
| 6 | 2 | 4 | 3 | 8,587 | 13,686 | 25,762 | 41,057 | 88.9 | 83.2 |
| 7 | 1 | 1 | 1 | 8,489 | 13,310 | 8,404 | 13,177 | 98.2 | 99.1 |
| 8 | 0.1 | 0 | 0.01 | 12,272 | 8,085 | 123 | 81 | 79.8 | 65.9 |
| 9 | 0.1 | 0 | 0.01 | 10,025 | 11,409 | 100 | 114 | | |
| 10 | 1 | 1 | 1 | 8,335 | 13,189 | 8,252 | 13,057 | | |
| 11 | 2 | 4 | 3 | 9,596 | 16,198 | 28,787 | 48,593 | | |
| 12 | 3 | 9 | 5 | 8,907 | 10,684 | 44,537 | 53,422 | | |
| 13 | 4 | 16 | 7 | 9,309 | 10,818 | 65,164 | 75,726 | | |
| 14 | 5 | 25 | 9 | 7,500 | 7,324 | 67,501 | 65,913 | | |
| 15 | 6 | 36 | 11 | 7,934 | 9,399 | 87,275 | 103,387 | | |
| 16 | 7 | 49 | 13 | 8,154 | 8,594 | 105,998 | 111,718 | | |

Table 2 collectively shows sampling positions (d) of 16 sheets in total of specimen plates (SPL) sampled from a portion in the vicinity of the electrode (site positioned at the lowest position in the furnace), values $d^2$ obtained by squaring the d, differences $\Delta d^2$ in the $d^2$ value between adjacent specimen plates, Bragg reflection intensities ($I^{<111>}$ and $I^{<220>}$) from Miller index planes <111> and <220> being measurement values, and evaluation values ($I^{<111>} \times \Delta d^2$ and $I^{<220>} \times \Delta d^2$) obtained by respectively multiplying the $I^{<111>}$ and $I^{<220>}$ by the differences $\Delta d^2$. Here, the average value of the "rotational symmetries" is 91% for <111>, and 84% for <220>.

TABLE 2

| SPL. No. | Distance from Center | | | Measurement Value | | Evaluation Value | | Rotational Symmetry | |
|---|---|---|---|---|---|---|---|---|---|
| | d (cm) | $d^2$ | $\Delta d^2$ | $I^{<111>}$ (cps) | $I^{<220>}$ (cps) | $I^{<111>} \times \Delta d^2$ | $I^{<220>} \times \Delta d^2$ | <111> (%) | <220> (%) |
| 1 | 7 | 49 | 13 | 8,764 | 9,320 | 113,938 | 121,154 | 96.9 | 90.8 |
| 2 | 6 | 36 | 11 | 8,728 | 8,753 | 96,013 | 96,280 | 97.2 | 92.5 |
| 3 | 5 | 25 | 9 | 8,642 | 8,783 | 77,774 | 79,043 | 87.2 | 95.9 |
| 4 | 4 | 16 | 7 | 8,985 | 7,486 | 62,892 | 52,399 | 94.7 | 84.4 |
| 5 | 3 | 9 | 5 | 9,267 | 11,092 | 46,336 | 55,461 | 97.6 | 96.2 |
| 6 | 2 | 4 | 3 | 8,969 | 11,219 | 26,906 | 33,656 | 87.7 | 90.3 |
| 7 | 1 | 1 | 1 | 9,648 | 14,925 | 9,552 | 14,775 | 85.9 | 55.8 |
| 8 | 0.1 | 0 | 0.01 | 9,664 | 6,258 | 97 | 63 | 78.2 | 62.8 |
| 9 | 0.1 | 0 | 0.01 | 12,030 | 9,119 | 120 | 91 | | |
| 10 | 1 | 1 | 1 | 8,381 | 9,524 | 8,298 | 9,428 | | |
| 11 | 2 | 4 | 3 | 7,930 | 10,184 | 23,789 | 30,552 | | |
| 12 | 3 | 9 | 5 | 9,495 | 10,676 | 47,474 | 53,382 | | |
| 13 | 4 | 16 | 7 | 9,471 | 8,754 | 66,297 | 61,277 | | |
| 14 | 5 | 25 | 9 | 9,824 | 9,147 | 88,418 | 82,324 | | |
| 15 | 6 | 36 | 11 | 8,490 | 8,122 | 93,392 | 89,345 | | |
| 16 | 7 | 49 | 13 | 8,500 | 8,500 | 110,503 | 110,505 | | |

Figure 2:
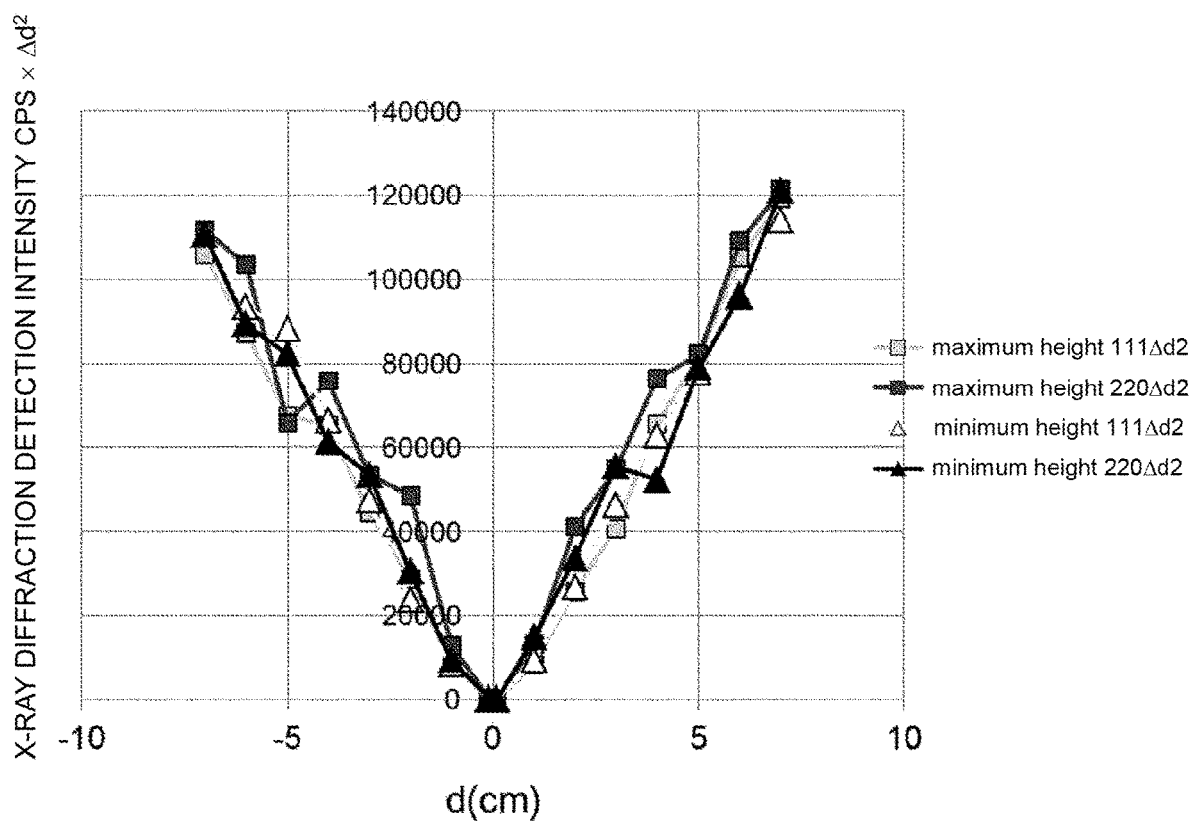
FIG. 2 is a graphic diagram of evaluation values ($I^{<111>} \times \Delta d^2$ and $I^{<220>} \times \Delta d^2$) obtained from 32 sheets in total of 16 sheets of specimen plates sampled from a portion in the vicinity of the bridge and 16 sheets thereof sampled from a portion in the vicinity of the electrode.

FIG. 2 is a graphic diagram of the evaluation values obtained from these 32 sheets of specimen plates.

The "rotational symmetry" in Table 1 and Table 2 is a value indicated in % according to the following procedure using a difference between evaluation values acquired from specimen plates positioned at axially symmetrical equal distances from the center axis. For example, in Table 1, since a specimen plate 6 is positioned at a distance d of 2 cm from the center, a specimen plate positioned at an axially symmetrical equal distance therefrom is a specimen 11; with respect to the evaluation value for the Miller index plane <111>, since that of the specimen 6 is 25,762 and that of the specimen 11 is 28,787, the difference is 3,025. A value indicated in % by dividing the value 3,025 by 27,275 of the average of the above evaluation values becomes 11.1%. A value obtained by subtracting 11.1% from 100% becomes 88.9%, and this value is determined to be a "rotational symmetry".

Specimens positioned at different sampling positions in the height direction are also subjected to the similar calculation, and the degree of the difference in the axial direction (height direction in a furnace) of the polycrystalline silicon rod is evaluated. For example, since the specimen plate 6 shown in Table 1 is positioned at a distance d of 2 cm from the center, a specimen in Table 2 corresponding to this specimen is a specimen 6. With respect to the evaluation value for the Miller index plane <111> of these specimens, since that of the specimen 6 in Table 1 is 25,762 and that of the specimen in Table 2 is 26,906, the difference is 1,144. A value indicated in % by dividing the value 1,144 by 26,334 of the average of the above evaluation values becomes 4.3%. The 4.3% is determined to be a "difference in rotational symmetry" in the axial direction.

Table 3 collectively shows "differences in rotational symmetry" in the axial direction determined by the above-mentioned calculation. Here, the average value of the "differences in rotational symmetry" is 10% for <111>, and 17% for <220>.

TABLE 3

| SPL. No. | Distance from Center | | | Difference in Rotational Symmetry (axial direction: %) | |
|---|---|---|---|---|---|
| | d (cm) | $d^2$ | $\Delta d^2$ | <111> | <220> |
| 1 | 7 | 49 | 13 | 4.4 | 0.2 |
| 2 | 6 | 36 | 11 | 8.9 | 12.5 |
| 3 | 5 | 25 | 9 | 5.3 | 4.1 |
| 4 | 4 | 16 | 7 | 4.0 | 37.2 |
| 5 | 3 | 9 | 5 | 13.5 | 1.6 |
| 6 | 2 | 4 | 3 | 4.3 | 19.8 |
| 7 | 1 | 1 | 1 | 12.8 | 11.4 |
| 8 | 0.1 | 0 | 0.01 | 23.8 | 25.5 |
| 9 | 0.1 | 0 | 0.01 | 18.2 | 22.3 |
| 10 | 1 | 1 | 1 | 0.5 | 32.3 |
| 11 | 2 | 4 | 3 | 19.0 | 45.6 |
| 12 | 3 | 9 | 5 | 6.4 | 0.1 |
| 13 | 4 | 16 | 7 | 1.7 | 21.1 |
| 14 | 5 | 25 | 9 | 26.8 | 22.1 |
| 15 | 6 | 36 | 11 | 6.8 | 14.6 |
| 16 | 7 | 49 | 13 | 4.2 | 1.1 |

In the present invention, a polycrystalline silicon rod having an above-mentioned "rotational symmetry" of 40% or higher is employed as a polycrystalline silicon rod suitable as a raw material for production of single crystal silicon by an FZ method. Further a polycrystalline silicon rod having an above-mentioned "difference in rotational symmetry" of 40% or lower is employed as a polycrystalline silicon rod suitable as a raw material for production of single crystal silicon by an FZ method.

The establishment of a criterion of the "difference in rotational symmetry" at 40% or lower is based on that when from relations between values of actual FZ, L % and resultant values of evaluation values calculated from values of characteristics, values of differences in the evaluation values when the obtained values of FZ, L % were 66% or higher were determined, the values of differences were 40% or higher. Here, it was judged that the number of n in the judgment of the establishment was sufficient and there was recognized a highly significant correlation against the criterion calculated from the correlation calculated statistically at a significant level of 1%.

Here, the "FZ, L %", when the length of a polycrystalline silicon rod is taken to be 100, refers to a length indicated in %, of the polycrystalline silicon rod, where crystal habit lines present in the crystalline silicon obtained by crystal growth in one-time FZ operation are present in the complete state. Incomplete crystal habit lines of course include lost crystal habit lines and also include disordered ones, bent ones and the like. Values of FZ, L % used in the present description are all those obtained by a one-time FZ operation, and are not those obtained by FZ operations in plural times. This is because carrying out of FZ operations in twice or more brings about reduction in productivity, and the twice or more FZ operations is not included in subjects in the present invention.

The value of FZ, L % does not necessarily need to be 100%; but a higher value thereof is better and the lower limit value thereof is, in consideration of productivity, about 60 to 70% and a polycrystalline silicon rod having the value lower than that cannot be used practically.

There are no special restrictions on what are the above-mentioned crystal characteristics, but examples thereof may include values of physical properties such as crystal formation amount, crystal orientation, crystal grain diameter, thermal diffusivity and thermal conductivity, and the distributions of these values of physical properties may be employed as crystal characteristics.

The procedure of measuring a diffraction intensity from a specific Miller index plane by using an X-ray diffractometry may be the same as that described in Patent Literatures 2 and 3.

Further the procedures of evaluating the crystal grain diameter and the crystal grain diameter distribution may be the same as those described in Patent Literature 4.

Further the procedures of evaluating the thermal diffusivity and the thermal conductivity may be the same as those described in Patent Literature 5.

The "rotational symmetry" has usually a tendency of being lower in the vicinity of the electrode than in the vicinity of the bridge. This tendency is similar even if the various conditions in the polycrystalline silicon deposition are varied. Crystal sites positioned at low positions in the furnace, since being near the carbon-made electrode cooled in a reaction process, conceivably have a lower CVD temperature than crystal sites positioned at high positions in the furnace.

Since this phenomenon cannot be solved unless the fundamental spatial structure arrangement and gas flow distribution of the Siemens method are changed, if a polycrystalline silicon rod in a certain distance from the carbon electrode position is cut and discarded as a solving measure, the length of the silicon rod for FZ is resultantly made to be shortened. Here is a need to determine what degree of the distance is to be secured, based on the homogeneity as an index in the height direction of crystals.

Although there can be thought of a method in which in order to secure the homogeneity in the axial direction, a reaction furnace is remodeled to be longish to elongate the length of a thermally flat portion, even under such a situation, the temperature reduction in the vicinity of the carbon electrode cannot be avoided and heterogeneous portions of crystals come to be generated in a certain proportion.

It has been found that with respect to the dependency of crystal characteristics of the polycrystalline silicon rod on sites in the height direction in the furnace, the homogeneity of crystals thus gradually decreases from high positions toward low positions. Therefore, in order to grasp the evaluation values of the polycrystalline silicon rod as a whole, there arises the need to evaluate specimens sampled from both end sites of the polycrystalline silicon rod.

When the evaluation of both the end sites is carried out, since the middle region is expected to be in the range of the evaluation values of these two sites, there is no need to positively evaluate the other region than both the end sites. That is, the evaluation of two positions in the height direction determines the evaluation values of the polycrystalline silicon rod as a whole, and rough profiles in the rod can be grasped. The present invention is, unlike simple measurement methods of physical properties in the growth direction (radial direction) as disclosed in Patent Literatures 2 to 5, an evaluation method of introducing novel evaluation values in which the amount of crystals in the radial direction is additionally taken into consideration, and further of also taking the (rotational) symmetry of crystals in the axial direction into consideration.

According to experiments carried out by the present inventors, when polycrystalline silicon rods having a "rotational symmetry" evaluated by the above-mentioned means of 40% or higher were used as a raw material for production of single crystal silicon by an FZ method, single crystal ingots having a proportion, of a length region where no loss of crystal habit lines was recognized, of 66% were obtained. Any of such polycrystalline silicon rods had the above-mentioned "difference in rotational symmetry" of 40% or lower. That is, when polycrystalline silicon rods having a "difference in rotational symmetry" of 40% or lower is used as a raw material for production of single crystal silicon by an FZ method, there are obtained single crystal ingots having a proportion, of a length region where no loss of crystal habit lines is recognized, of 66%.

Further since the homogeneity of crystals is generally lower in the vicinity of the carbon electrode than in the vicinity of the bridge, when zone melting is initiated in single crystal silicon production process by an FZ method, the initiation from a portion in the vicinity of the bridge more hardly brings about the loss of crystal habit lines. The reason therefor is conceivably that crystal habit lines have a tendency of continuation in which the crystal habit lines are, even when many or few fluctuations occur after the crystal habit lines have once been formed, zone melted as they are, and in the case where fluctuations out of the acceptable range occur, the crystal habit lines are lost.

For these reasons, in the case where the zone melting is initiated from a portion in the vicinity of the carbon electrode, a possibility of loss of crystal habit lines in the course of the zone melting becomes high; thus, the case becomes more disadvantageous than the initiation from a portion in the vicinity of the bridge. Hence, it is desirable that the zone melting process for FZ be initiated from a portion in the vicinity of the bridge.

Table 4 comparatively shows values of FZ, L % in the case where zone melting was initiated from a portion in the vicinity of a bridge, and values of FZ, L % in the case where zone melting was initiated from a portion in the vicinity of an electrode, for each of four polycrystalline silicon rods (a, b, c and d).

TABLE 4

| Polycrystalline Silicon Rod | Initiated from Bridge Vicinity (FZ, L %) | Initiated from Electrode Vicinity (FZ, L %) |
|---|---|---|
| a | 100 | 91 |
| b | 76 | 69 |
| c | 66 | 40 |
| d | 2 | 0 |

The method for evaluating crystals according to the present invention can be summarized as follows. That is, the method is a method for evaluating crystals of a polycrystalline silicon rod to be used as a raw material for production of single crystal silicon by an FZ method, wherein a plurality of specimen plates each having, as the principal plane, a cross-section perpendicular to a radial direction of the polycrystalline silicon rod grown by a Siemens method are sampled at equal intervals in the radial direction; values of a crystal characteristic of the specimen plates are determined by measurements; and the homogeneity of the polycrystalline silicon rod is evaluated from evaluation values obtained by multiplying the amount of crystals (relative amount of crystals) at sites where the specimen plates have been sampled by the values of crystal characteristics.

Further the means for evaluating the "rotational symmetry" employed in the present invention can be summarized as follows. That is, the means comprises a step of determining the above evaluation values of two specimens sampled from sites at symmetrical positions about the center axis of the polycrystalline silicon rod, calculating a rotational symmetry from the obtained two evaluation values A and B by the following expression:

$$100-(|A-B|/(A+B)/2)\times 100,$$

and evaluating whether or not the average value in the axial direction of the rotational symmetries is 40% or higher.

Further the means for evaluating the "difference in rotational symmetry" employed in the present invention can be summarized as follows. That is, the means comprises a step of determining the above evaluation values of two specimens sampled from sites positioned at equal distances in the radial direction from the center axis of the polycrystalline silicon rod and on the same generating line in the case where the polycrystalline silicon rod is approximated to a cylinder, calculating a difference in rotational symmetry from the obtained two evaluation values C and D by the following expression:

$$(|C-D|/(C+D)/2)\times 100,$$

and evaluating whether or not the average value in the axial direction of the differences in rotational symmetry is 40% or lower.

Hereinafter, Experimental Examples (Examples and Comparative Examples) will be described.

Experimental Example 1

Experimental Example 1 is a study of the influence of the external shape of a polycrystalline silicon rod on FZ, L %.

The study results are shown in Table 5. Comparative Examples were polycrystalline silicon rods as they were synthesized by a Siemens method; and Examples were the polycrystalline silicon rods formed by cylindrically grinding the above polycrystalline silicon rods.

TABLE 5

| Comparative Examples | | | | Examples | | | |
|---|---|---|---|---|---|---|---|
| Diameter (mm) | $\Delta D_1$ | $\Delta D_2$ | FZ, L % | Diameter (mm) | $\Delta D_1$ | $\Delta D_2$ | FZ, L % |
| 153-158 | 5 | 9 | 18 | 153-158 | 3 | 6 | 74 |
| 130-134 | 4 | 7 | 24 | 130-134 | 3 | 5 | 68 |

In all Examples, the difference $\Delta D_1$ between a maximum value $D_{max}$ and a minimum value $D_{min}$ of diameters over the entire length was 3 mm or smaller, and the difference $\Delta D_2$ between a maximum value $D_{max}$ and a minimum value $D_{min}$ of diameters of a nearly cylindrical virtual rotating body formed at a time when the polycrystalline silicon rod was rotated about the center axis in the extension direction was 6 mm or smaller. By contrast, in all Comparative Examples, the $\Delta D_1$ was larger than 3 mm and also the $\Delta D_2$ was larger than 6 mm.

Then, in all Examples, the FZ, L % exceeded 66, whereas in all Comparative Examples, the FZ, L % was far below this.

Experimental Example 2

The results of Experimental Example 2 are shown in Tables 1 to 3.

As described already, in the present invention, a polycrystalline silicon rod having a "rotational symmetry" of 40% or higher is adopted as a polycrystalline silicon rod suitable as a raw material for production of single crystal silicon by an FZ method. A polycrystalline silicon rod having the above "difference in rotational symmetry" of 40% or lower as a polycrystalline silicon rod suitable is adopted as a raw material for production of single crystal silicon by an FZ method.

Experimental Example 3

In Experimental Example 3, for specimens sampled from the vicinity of the bridge of each of 5 polycrystalline silicon rods having different FZ, L % (100, 76, 66, 52 and 2) and specimens sampled from the vicinity of the electrode thereof, the rotational symmetry (average value) and the difference in rotational symmetry (average value) were investigated. In Examples here, there were employed Bragg reflection intensities from the Miller index planes <111> and <220> as crystal characteristics for determining evaluation values. The results are shown collectively in Table 6.

TABLE 6

| | Rotational Symmetry (bridge vicinity: %) | | Rotational Symmetry (electrode vicinity: %) | | Difference in Rotational Symmetry (axial direction: %) | |
|---|---|---|---|---|---|---|
| FZ, L % | <111> | <220> | <111> | <220> | <111> | <220> |
| 100 | 88 | 89 | 91 | 84 | 10 | 17 |
| 76 | 57 | 53 | 45 | 41 | 25 | 28 |

TABLE 6-continued

| FZ, L % | Rotational Symmetry (bridge vicinity: %) | | Rotational Symmetry (electrode vicinity: %) | | Difference in Rotational Symmetry (axial direction: %) | |
|---|---|---|---|---|---|---|
| | <111> | <220> | <111> | <220> | <111> | <220> |
| 66 | 41 | 40 | 42 | 40 | 35 | 39 |
| 52 | 30 | 29 | 28 | 30 | 55 | 50 |
| 2 | 9 | 7 | 10 | 9 | 85 | 95 |

According to the results collectively shown in the table, the case where the average value in the axial direction of the rotational symmetries was 40% or higher, and the average value in the axial direction of the differences in rotational symmetry was 40% or lower had an FZ, L % of 66% or higher.

Experimental Example 4

Also in Experimental Example 4, for specimens sampled from the vicinity of the bridge of each of 5 polycrystalline silicon rods having different FZ, L % (100, 76, 66, 52 and 2) and specimens sampled from the vicinity of the electrode thereof, the rotational symmetry (average value) and the difference in rotational symmetry (average value) were investigated. In Examples here, there were employed the orientations of the Miller index planes <111> and <220> as crystal characteristics for determining evaluation values; and specifically, there were employed areal ratios (%) of diffraction intensities from the Miller index planes <111> and <220>. The results are shown collectively in Table 7.

TABLE 7

| FZ, L % | Rotational Symmetry (bridge vicinity: %) | | Rotational Symmetry (electrode vicinity: %) | | Difference in Rotational Symmetry (axial direction: %) | |
|---|---|---|---|---|---|---|
| | <111> | <220> | <111> | <220> | <111> | <220> |
| 100 | 64 | 63 | 74 | 78 | 27 | 31 |
| 76 | 68 | 55 | 69 | 50 | 28 | 35 |
| 66 | 48 | 40 | 51 | 40 | 32 | 40 |
| 52 | 15 | 13 | 9 | 8 | 48 | 52 |
| 2 | 6 | 4 | 5 | 4 | 79 | 96 |

Also in the results collectively shown in the table, the case where the average value in the axial direction of the rotational symmetries was 40% or higher, and the average value in the axial direction of the differences in rotational symmetry was 40% or lower had an FZ, L % of 66% or higher.

Experimental Example 5

Also in Experimental Example 5, for specimens sampled from the vicinity of the bridge of each of 5 polycrystalline silicon rods having different FZ, L % (100, 76, 66, 52 and 2) and specimens sampled from the vicinity of the electrode thereof, the rotational symmetry (average value) and the difference in rotational symmetry (average value) were investigated. In Examples here, there were employed average particle diameter distributions measured by an EBSD method as crystal characteristics for determining evaluation values. The results are shown collectively in Table 8.

TABLE 8

| FZ, L % | Rotational Symmetry (bridge vicinity: %) | Rotational Symmetry (electrode vicinity: %) | Difference in Rotational Symmetry (axial direction: %) |
|---|---|---|---|
| 100 | 70 | 60 | 25 |
| 76 | 55 | 50 | 30 |
| 66 | 45 | 40 | 38 |
| 52 | 33 | 28 | 52 |
| 2 | 4 | 4 | 96 |

According to the results collectively shown in the table, the case where the average value in the axial direction of the rotational symmetries was 40% or higher, and the average value in the axial direction of the differences in rotational symmetry was 40% or lower had an FZ, L % of 66% or higher.

Experimental Example 6

Also in Experimental Example 6, for specimens sampled from the vicinity of the bridge of each of 5 polycrystalline silicon rods having different FZ, L % (100, 76, 66, 52 and 2) and specimens sampled from the vicinity of the electrode thereof, the rotational symmetry (average value) and the difference in rotational symmetry (average value) were investigated. In Examples here, there were employed the thermal diffusivities as crystal characteristics for determining evaluation values. Here, since the thermal conductivity is a value obtained by multiplying the thermal diffusivity by the density and the specific heat, values of both have no difference. The results are shown collectively in Table 9.

TABLE 9

| FZ, L % | Rotational Symmetry (bridge vicinity: %) | Rotational Symmetry (electrode vicinity: %) | Difference in Rotational Symmetry (axial direction: %) |
|---|---|---|---|
| 100 | 95 | 93 | 29 |
| 76 | 87 | 81 | 35 |
| 66 | 55 | 41 | 38 |
| 52 | 42 | 39 | 45 |
| 2 | 4 | 4 | 91 |

According to the results collectively shown in the table, the case where the average value in the axial direction of the rotational symmetries was 40% or higher, and the average value in the axial direction of the differences in rotational symmetry was 40% or lower had an FZ, L % of 66% or higher.

Experimental Example 7

In Experimental Example 7, a pair (two wires) of silicon core wires was assembled in a reverse U-shape through a bridge and polycrystalline silicon was deposited; one polycrystalline silicon rod (two rods in total) collected from each of both leg sections of the deposited polycrystalline silicon was used; for the one rod (polycrystalline silicon rod), an FZ process was initiated from a portion in the vicinity of the bridge and for the other one (polycrystalline silicon rod), the FZ process was initiated from a portion in the vicinity of the electrode; and obtained values for FZ, L % of the single crystal silicon were compared. Here, the polycrystalline silicon used in the experiment was included ones grown by four different Siemens processes of A to D. The results are shown in Table 10.

TABLE 10

| Polycrystalline Silicon | Initiated from Bridge Vicinity Portion | Initiated from Electrode Vicinity Portion |
|---|---|---|
| A | 100 | 91 |
| B | 76 | 69 |
| C | 66 | 40 |
| D | 2 | 0 |

According to the results collectively shown in the table, even if polycrystalline silicon rods essentially of the same quality were used, the case where the FZ process was initiated from a portion in the vicinity of the bridge exhibited a higher value of FZ, L % than the case where the FZ process was initiated from a portion in the vicinity of the electrode.

Therefore, in the case where when FZ single crystal silicon is produced by using a polycrystalline silicon rod as a raw material, there is used, as the polycrystalline silicon rod, a polycrystalline silicon rod collected from a leg section of a reverse U-shape polycrystalline silicon section obtained by assembling one pair (two wires) of silicon core wires through a bridge in a reverse U-shape and depositing polycrystalline silicon, when one end side of the polycrystalline silicon rod is made to be a portion in the vicinity of the bridge in a depositing furnace, and the other end side is made to be a portion in the vicinity of the electrode in the depositing furnace, it is preferable that the floating zone melting step be initiated from the portion in the vicinity of the bridge of the polycrystalline silicon rod.

INDUSTRIAL APPLICABILITY

The present invention provides a technology for providing a polycrystalline silicon rod, excellent in the homogeneity in shape and the homogeneity in crystal characteristics, suitable as a raw material for production of single crystal silicon by an FZ method.

REFERENCE SIGNS LIST

1 SILICON CORE WIRE
10 POLYCRYSTALLINE SILICON ROD
11 ROD
12 SPECIMEN PLATE

The invention claimed is:
1. A polycrystalline silicon rod to be used as a raw material for production of single crystal silicon by a float zone (FZ) melting method,
wherein
the polycrystalline silicon rod has an entire length of 500 mm or larger and an average diameter of 130 mm or larger and 300 mm or smaller,
a circularity of a plurality of cross-sections perpendicular to a cylindrical shaft of the polycrystalline silicon rod taken over the entire length of the polycrystalline silicon rod is configured so that a first difference $\Delta D_1$ between a first maximum value and a first minimum value of diameters of two concentric circles of each of the plurality of cross-sections is 3 mm or smaller over the entire length of the polycrystalline silicon rod, the first difference $\Delta D_1$ being determined by measuring a difference ($\Delta D_1/2$) between radii of the two concentric circles of each of the plurality of cross-sections,
a second difference $\Delta D_2$ between a second maximum value and a second minimum value of diameters of a nearly cylindrical virtual rotating body formed when the polycrystalline silicon rod is rotated about a center axis in an extension direction thereof is 6 mm or smaller,
an average rotational symmetry of the polycrystalline silicon rod over the entire length of the polycrystalline silicon rod is 40% or more, and
the average rotational symmetry is calculated by:
(i) sampling a plurality of specimen plates each having, as a principal plane thereof, a cross-section perpendicular to a radial direction of the polycrystalline silicon rod, the plurality of specimen plates being sampled at equal intervals in the radial direction;
(ii) determining evaluation values A, B of a pair of the plurality of specimen plates sampled from sites at symmetrical positions about a center axis of the polycrystalline silicon rod, wherein the evaluation value A is determined as a function of a crystal characteristic of a first specimen plate sampled from a site, positioned at a first distance from the center axis of the polycrystalline silicon rod, in the polycrystalline silicon rod, and the evaluation value B is determined as a function of the crystal characteristic of a second specimen plate sampled from a site, positioned at a second distance that is symmetrically equal to the first distance with respect to the center axis of the polycrystalline silicon rod, in the polycrystalline silicon rod;
(iii) calculating a rotational symmetry from the evaluation values A and B, which are related to homogeneity in the crystal characteristic, according to the equation: $100-[|A-B|/((A+B)/2)\times 100]$; and
(iv) repeating steps (i) to (iii) at different intervals along the entire length of the polycrystalline silicon rod to obtain the average rotational symmetry,
the crystal characteristic is one selected from the group consisting of an amount of crystals formed, a crystal orientation, a crystal grain diameter, a thermal diffusivity, and a thermal conductivity.
2. A polycrystalline silicon rod to be used as a raw material for production of single crystal silicon by a float zone (FZ) melting method,
wherein
the polycrystalline silicon rod has an entire length of 500 mm or larger and an average diameter of 130 mm or larger and 300 mm or smaller,
a circularity of a plurality of cross-sections perpendicular to a cylindrical shaft of the polycrystalline silicon rod taken over the entire length of the polycrystalline silicon rod is configured so that a first difference $\Delta D_1$ between a first maximum value and a first minimum value of diameters of two concentric circles of each of the plurality of cross-sections is 3 mm or smaller over the entire length of the polycrystalline silicon rod, the first difference $\Delta D_1$ being determined by measuring a difference ($\Delta D_1/2$) between radii of the two concentric circles of each of the plurality of cross-sections,
a second difference $\Delta D_2$ between a second maximum value and a second minimum value of diameters of a nearly cylindrical virtual rotating body formed when the polycrystalline silicon rod is rotated about a center axis in an extension direction thereof is 6 mm or smaller, an average difference in rotational symmetry of the polycrystalline silicon rod over the entire length of the polycrystalline silicon rod is 40% or less, and the average difference in rotational symmetry is calculated by:

(i) obtaining a first sampling rod from a first end of the polycrystalline silicon rod, and a second sampling rod from a second end of the polycrystalline silicon rod opposite to the first end in an axial direction, (ii) sampling a plurality of specimen plates from each of the first and second sampling rods, each of the plurality of specimen plates having, as a principal plane thereof, a cross-section perpendicular to an axial direction of each of the first and second sampling rods, the plurality of specimen plates being sampled at equal intervals in the axial direction;

(iii) determining evaluation values C, D, wherein the evaluation value C is determined as a function of a crystal characteristic of a third specimen plate sampled from a site, positioned at a third distance from a center axis of the first sampling rod, in the polycrystalline silicon rod, and the evaluation value D is determined as a function the crystal characteristic of a fourth specimen plate sampled from a site, positioned at a fourth distance that is equal to the third distance from a center of the second sampling rod, in the polycrystalline silicon rod;

(iv) calculating a difference in rotational symmetry from the evaluation values C and D, which are related to homogeneity in the crystal characteristic, according to the equation: $[|C-D|/((C+D)/2)/2] \times 100$; and (v) repeating steps (i) to (iv) at different intervals along the entire length of the polycrystalline silicon rod to obtain the average difference in rotational symmetry, the crystal characteristic is one selected from the group consisting of an amount of crystals formed, a crystal orientation, a crystal grain diameter, a thermal diffusivity, and a thermal conductivity.

3. The polycrystalline silicon rod according to claim 1, wherein the crystal characteristic is the crystal orientation, and wherein the crystal characteristic is obtained by Bragg reflection intensity from Miller index plane <111> or Miller index plane <220>.

4. The polycrystalline silicon rod according to claim 1, wherein the evaluation values A and B are each calculated as a function of the crystal characteristic and a difference between the first and second distances, respectively, and a distance of an adjacent specimen plate from the center axis of the polycrystalline silicon rod.

5. The polycrystalline silicon rod according to claim 2, wherein the crystal characteristic is the crystal orientation, and wherein the crystal characteristic is obtained by Bragg reflection intensity from Miller index plane <111> or Miller index plane <220>.

6. The polycrystalline silicon rod according to claim 2, wherein the evaluation values C and D are each calculated as a function of the crystal characteristic and a difference between the third and fourth distances, respectively, and a distance of an adjacent specimen plate from the center axis of the first and second sampling rods, respectively.

* * * * *